United States Patent
Becker et al.

(10) Patent No.: US 6,812,154 B2
(45) Date of Patent: Nov. 2, 2004

(54) PLASMA ETCHING METHODS

(75) Inventors: David S. Becker, Boise, ID (US); Bradley J. Howard, Boise, ID (US); Kevin G. Donohoe, Boise, ID (US)

(73) Assignee: Micron Technology, INC, Boise, ID (US)

( * ) Notice: Subject to any disclaimer, the term of this patent is extended or adjusted under 35 U.S.C. 154(b) by 13 days.

(21) Appl. No.: 10/273,851

(22) Filed: Oct. 17, 2002

(65) Prior Publication Data

US 2003/0036283 A1 Feb. 20, 2003

Related U.S. Application Data

(63) Continuation of application No. 09/492,738, filed on Jan. 27, 2000, now Pat. No. 6,492,279.

(51) Int. Cl.$^7$ .............................................. H01L 21/302
(52) U.S. Cl. ......................... 438/714; 438/723; 438/724
(58) Field of Search ................................. 438/692, 706, 438/712, 713, 714, 723, 724, 734, 738; 216/12, 38, 65, 67

(56) References Cited

U.S. PATENT DOCUMENTS

| | | | |
|---|---|---|---|
| 5,269,879 A | | 12/1993 | Rhoades et al. |
| 5,286,344 A | | 2/1994 | Blalock et al. |
| 5,296,095 A | | 3/1994 | Nabeshima et al. |
| 5,626,716 A | | 5/1997 | Bosch et al. |
| 5,632,910 A | | 5/1997 | Nagayama et al. |
| 5,639,519 A | | 6/1997 | Patrick et al. |
| 5,658,425 A | | 8/1997 | Halman et al. |
| 5,814,563 A | * | 9/1998 | Ding et al. .................. 438/714 |
| 5,882,538 A | * | 3/1999 | Martin et al. .................. 216/71 |
| 5,980,999 A | * | 11/1999 | Goto et al. .................. 427/572 |
| 6,083,822 A | * | 7/2000 | Lee .............................. 438/624 |
| 6,121,150 A | | 9/2000 | Avanzino et al. |
| 6,180,497 B1 | * | 1/2001 | Sato et al. .................. 438/458 |
| 6,436,229 B2 | * | 8/2002 | Tai et al. ............... 257/E21.28 |
| 6,635,335 B1 | | 10/2003 | Donohoe et al. ........... 428/156 |

* cited by examiner

Primary Examiner—Kin-Chan Chen
(74) Attorney, Agent, or Firm—Wells St. John P.S.

(57) ABSTRACT

A patterned organic masking layer is formed outwardly of a feature layer to be etched. It has at least one feature pattern having a minimum feature dimension of less than or equal to 0.3 micron. The feature layer has a thickness which is to be etched to form the one feature pattern in the feature layer. The feature pattern is plasma etched into the feature layer using the masking layer as a mask. The plasma etching comprises at least one etching segment where at least 30% of said thickness of the feature layer is etched using an etching gas comprising one gas compound comprising carbon, hydrogen and at least one halogen present at greater than or equal to 70% concentration by volume as compared to all carbon, hydrogen and halogen containing gas compounds in the etching gas. Such plasma etching is conducted under conditions effective to produce at least that portion of the one feature pattern in the feature layer formed during the one etching segment to have a sidewall taper, if any, of less than or equal to 5° and an organic masking layer top outer surface roughness proximate the feature pattern at a conclusion of the etching segment which is characterizable by an average value less than 100 Angstroms. Such value is determinable by scanning electron microscopy as an average maximum size of all surface discernible objects of the patterned masking layer as measured and averaged along any 0.3 micron length of top outer surface from the one feature pattern. Other implementations are also contemplated.

53 Claims, 3 Drawing Sheets

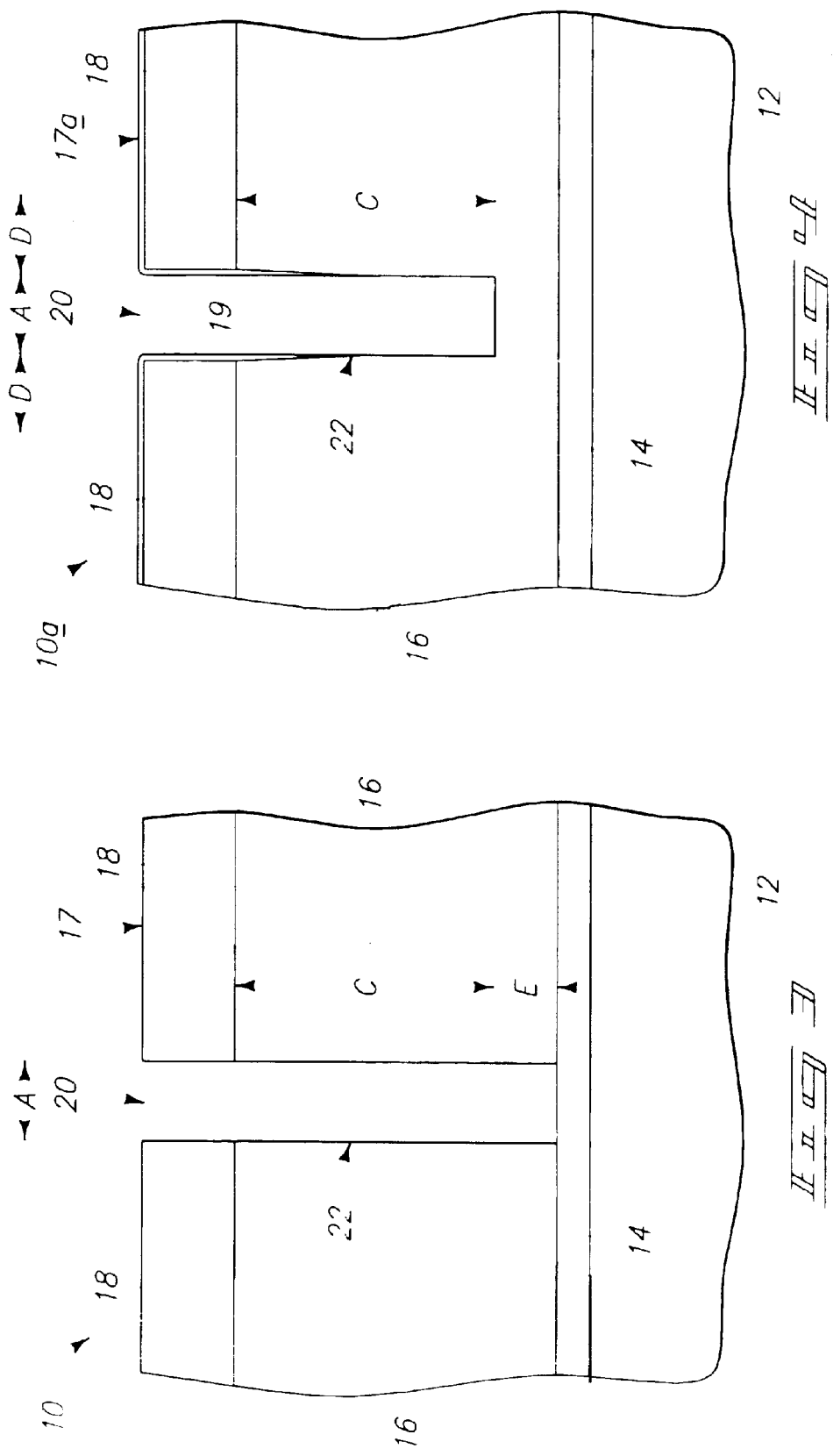

PLASMA ETCHING METHODS

CROSS REFERENCE TO RELATED APPLICATION

This patent application is a continuation application of U.S. patent application Ser. No. 09/492,738, filed on Jan. 27, 2000, now U.S. Pat. No. 6,492,279 entitled "Plasma Etching Methods", naming David S. Becker. Bradley J. Howard and Kevin G. Donohoe as inventors, the disclosure of which is incorporated by reference.

TECHNICAL FIELD

This invention relates to plasma etching methods.

BACKGROUND OF THE INVENTION

Integrated circuitry density continues to increase and feature dimensions continue to get smaller. One aspect of semiconductor integrated circuitry fabrication is the etching of contact openings through insulating layers, such as borophosphosilicate glass (BPSG), to expose inward circuit regions to which electrical connection is desired.

Contact openings are typically presently formed by depositing an organic masking layer (photoresist, being one example) outwardly of the layer within which the opening is to be formed. The masking layer is patterned to leave desired contact openings therethrough while leaving other areas of the layer covered (i.e., masked) such that etching will not there occur. The insulating layer is thereafter etched through the organic masking layer openings, preferably highly selectively to remove the insulating layer at a substantially greater rate than any etching of the masking layer. The ultimate goal is to outwardly expose a desired region of the underlying substrate.

Forming such openings is preferably conducted using a highly anisotropic etch, such as a plasma etch. One such prior art etch employs an Applied Materials IPS Dielectric Etcher using reactive gas flows of $CHF_3$ and $CHF_3$ at a volumetric ratio of 11:9, respectively. It was discovered using such chemistry that as the minimum feature dimension of the contact opening fell to 0.3 micron and below. the etched sidewalls of the feature layer being etched were becoming striated or otherwise roughened to a degree sufficient to impact critical dimension (CD) of the feature and overall yield. Such roughening apparently resulted from formation of striations or other roughenings in the opening sidewalls of the photoresist, which were being mask transferred to the feature layer. Such roughening was more prone to occur in useful processing windows in high density deposition tools, namely in processing windows where acceptable uniformity across the substrate could be achieved. Such sidewall striations might also have occurred in etching of larger contact openings, but were not problematic due to the larger opening dimensions. However at the 0.3 micron level and below, roughened or otherwise striated sidewalls within a feature opening (i.e., a damascene trough, a contact opening or other feature) can adversely affect CD and yield.

The invention was motivated in addressing and overcoming this particular problem, yet is not so limited. Aspects of the invention are seen to have applicability to other aspects of plasma etching, with the invention only being limited by the accompanying claims, appropriately interpreted in accordance with the Doctrine of Equivalents.

SUMMARY

The invention comprises plasma etching methods. In one implementation, a patterned organic masking layer is formed outwardly of a feature layer to be etched. The patterned organic masking layer has at least one feature pattern having a minimum feature dimension of less than or equal to 0.3 micron. The feature layer has a thickness inwardly of the one feature pattern which is to be etched to form the one feature pattern in the feature layer. The at least one feature pattern is plasma etched into the feature layer using the organic masking layer as a mask. The plasma etching comprises at least one etching segment where at least 30% of said thickness of the feature layer is etched using an etching gas comprising one gas compound comprising carbon, hydrogen and at least one halogen present in the etching gas at greater than or equal to 70% concentration by volume as compared to all carbon, hydrogen and halogen containing gas compounds in the etching gas. Such plasma etching is conducted under conditions effective to produce at least that portion of the one feature pattern in the feature layer formed during the one etching segment to have a sidewall taper of less than or equal to 5° and an organic masking layer top outer surface roughness proximate the feature pattern at a conclusion of the etching segment which is characterizable by an average value less than 100 Angstroms. Such average value is determinable by scanning electron microscopy as an average maximum size of all surface discernible objects of the patterned masking layer as measured and averaged along any 0.3 micron length of top outer surface from the one feature pattern.

Other implementations are also contemplated.

BRIEF DESCRIPTION OF THE DRAWINGS

Preferred embodiments of the invention are described below with reference to the following accompanying drawings.

FIG. 3 is a view of the FIG. 1 wafer fragment at a processing step subsequent to that depicted by FIG. 2.

FIG. 4 is a diagrammatic sectional view of an alternate embodiment semiconductor wafer fragment at a processing step in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
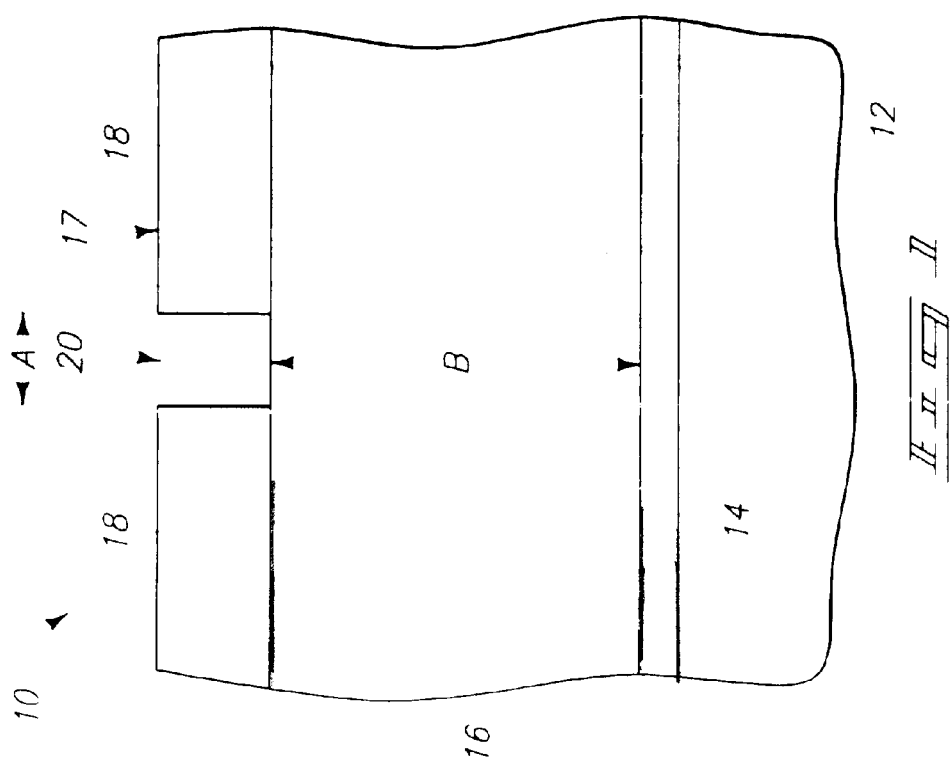
FIG. 1 is a diagrammatic sectional view of a semiconductor wafer fragment in process in accordance with an aspect of the invention.

FIG. 1 illustrates a wafer fragment to be etched indicated generally with reference numeral 10. Such comprises a bulk monocrystalline silicon substrate 12 having an exemplary diffusion region 14 formed therein. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Alternate substrates from substrate 12 are of course usable in the invention.

A feature layer 16 to be plasma etched is formed outwardly of substrate 12. In the preferred and reduction-to-practice examples, the feature to be etched within layer 16 is in the form of a contact opening, with layer 16 predominately comprising silicon dioxide, such as BPSG. The invention is not, however, in any way limited to contact opening formation nor to etching into predominately silicon dioxide comprising layers. Aspects of the inventions are applicable to etching other features, by way of example only, damascene trough lines in insulative materials, polysilicon conductive features, and etching of other materials (i.e., $Si_3N_4$) to produce features in the form of openings or projections, whether conductive or not conductive. An organic masking layer 18 is formed outwardly of feature layer 16, and is patterned to form the desired feature patterns therethrough. One example organic masking layer is a photoresist, such as SEPR 402 available from SHIN-ITSU of Tokyo, Japan. Masking layer 18 has a top outer surface 17. Exemplary thicknesses for layers 16 and 18 are 21,000 Angstroms and 8,300 Angstroms, respectively.

An exemplary feature pattern in the form of a contact opening 20 is formed in layer 18, and in preferred implementations has some minimum feature dimension A which is less than or equal to 0.3 micron. Also for purposes of the continuing discussion, feature layer 16 has some thickness B inwardly of feature pattern 20 which is to be etched to form the one feature pattern in feature layer 16. Of course almost universally, identical and/or other features are being etched elsewhere in layer 16, with only a single feature 20 being shown for example.

Figure 2:
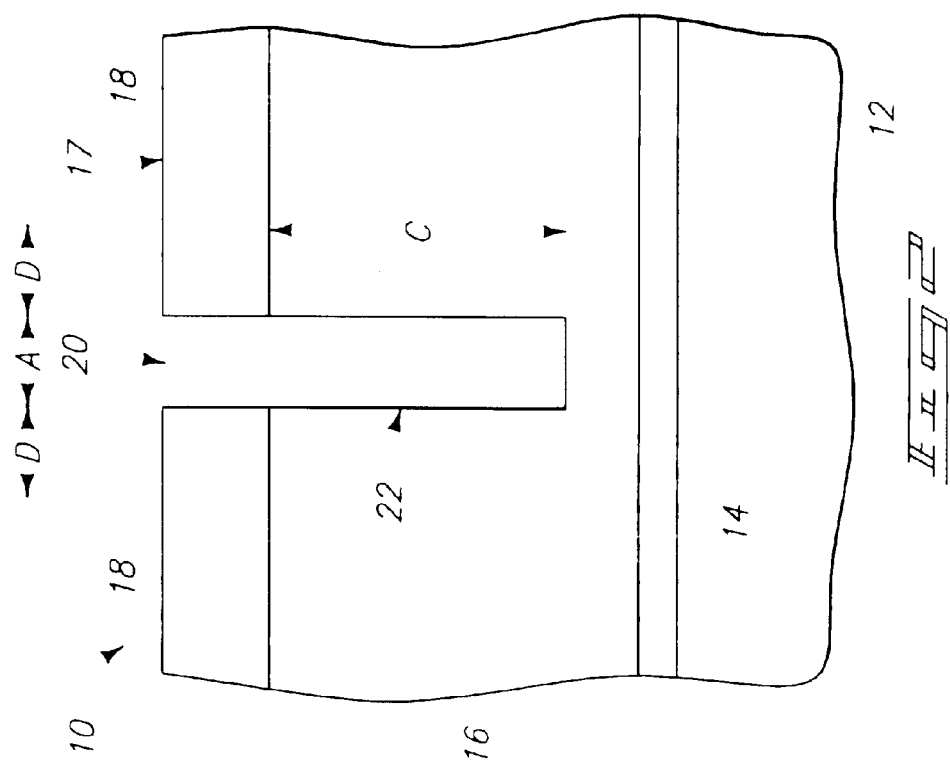
FIG. 2 is a view of the FIG. 1 wafer fragment at a processing step subsequent to that depicted by FIG. 1.

Referring to FIGS. 2 and 3, the at least one feature pattern 20 in organic masking layer 18 is plasma etched into feature layer 16 using organic masking layer 18 as a mask to form a feature 22. The plasma etching comprises at least one etching segment C where at least 30% of thickness B (FIG. 1) of feature layer 16 is etched using an etching gas comprising one gas compound comprising carbon, hydrogen and at least one halogen present in the etching gas at greater than or equal to 70% concentration by volume as compared to all carbon, hydrogen and halogen containing gas compounds in the etching gas. The one etching segment preferably comprises high density plasma, which in the context of this document is defined to mean any plasma etching achieving a density of at least $10^9$ ions/cm$^3$. An example reactor is a dual source, high density plasma etcher such as an IPS Dielectric Etcher from Applied Materials, Inc., of Santa Clara, Calif. Other type etching tools are also of course contemplated such as, by way of example only, parallel plate etchers that have one or more power supplies and/or etchers that use magnetic fields to affect the motion of charged species inside the chamber.

FIG. 2 illustrates approximately 80% of thickness "B" of layer 16 being etched in the one etching segment, with only a little reduction in the thickness of organic masking layer 18 occurring during the etch as typically occurs with such layer during high density plasma etching. The invention also of course contemplates other percentages of thickness being etched. Further, and by way of example only, the plasma etching can comprises only one etching segment where 100% of the thickness of the feature layer is etched using said etching gas.

Preferably, the one gas compound is present in the etching gas at greater than or equal to 80% concentration by volume as compared to any other carbon, hydrogen and halogen containing gas compound(s) in the etching gas during the one etching segment. Even more preferably, such gas is present at a 90% concentration by volume, as compared to any other carbon, hydrogen and halogen containing gas compound in the etching gas during the one etching segment. Even more preferably, such gas is present at a 95% concentration by volume, as compared to any other carbon, hydrogen and halogen containing gas compound in the etching gas during the one etching segment. Even more preferably, such gas is present at a 100% concentration by volume, as compared to any other carbon, hydrogen and halogen containing gas compound(s) in the etching gas during the one etching segment. An example preferred gas compound is $CH_2F_2$. An example additional gas compound comprising carbon, hydrogen and at least one halogen present in the etching gas at less than 30% concentration with the $CH_2F_2$ is $CHF_3$. The plasma etching during the one segment is preferably void of any etching gases having carbon-nitrogen bonds, carbon-oxygen bonds, and oxygen-oxygen bonds.

Plasma etching during the one segment is most preferably effective to produce at least that portion of feature pattern 22 in feature layer 16 formed during the one plasma etching segment to have a sidewall taper, if any, of less than or equal to 5°, with a preferred lack of taper essentially being depicted in FIGS. 2 and 3. Further most preferably and in accordance with what motivated the invention, top outer surface 17 of organic masking layer 18 will have a roughness proximate feature pattern 20 at a conclusion of the one etching segment which is characterizable by an average value less than 100 Angstroms. This average value is determinable by scanning electron microscopy as an average maximum size of all surface discernible objects of patterned masking layer 18 as measured and averaged along any 0.3 micron length D (FIG. 2) of top outer surface 17 from feature pattern 20. More preferably, the average surface roughness value is less than or equal to 50 Angstroms.

Top outer surface roughness created by the plasma etching has been determined to be of some significance in the sidewall roughness of masking layer 18 within feature pattern opening 20, particularly in the implementations where using an etching gas comprising one gas compound comprising carbon, hydrogen and at least one halogen present in the etching gas at greater than or equal to 70% concentration by volume as compared to all carbon, hydrogen and halogen containing gas compounds. Regardless, and although somewhat undesirable, the combination of a rough top outer masking layer surface and smooth masking layer feature sidewalls was not observed in reduction-to-practice examples, and was also not observed when operating below the above stated 70% concentration. At and above the above stated minimum 70% concentration, power parameters can be readily selected, if desired, by a person of skill in the art to arrive at a sidewall roughness which matches or shadows that of the top surface roughness.

Further, it was observed in reduction-to-practice examples that the masking layer sidewall roughness which was the determining factor in etched feature layer sidewall roughness/striations (and attendant CD change) was that closest to the feature layer. Roughness or striations formed by the etching in the masking layer adjacent the top outer surface but not where the masking layer joins the feature layer did not mask transfer into the feature layer.

Referring more specifically to FIG. 3, plasma etching is further conducted to comprise another etching segment E which is conducted after the one etching segment, and which is not necessarily the same as the one segment. Accordingly, such further etching may or may not increase roughness in the sidewalls of materials 16 and 18. Most preferably, the degree of further etching (i.e., conditions and time of etch) is not sufficiently great such that the sidewall smoothness of layer 16 created by etching segment C is maintained at the conclusion of the final illustrated etching and also occurs in etching segment E. In the described embodiment, an example additional etching segment E would use an etching gas comprising $CH_2F_2$ and $CHF_3$, with the $CHF_3$ being present at greater than 30% by volume of a total of the $CH_2F_2$ and $CHF_3$ gases.

The above-described first embodiment had the organic masking layer comprising photoresist with the average maximum value of the organic layer top outer surface roughness being that of the photoresist top outer surface at the conclusion of the one etching segment. FIG. 4 illustrates an alternate embodiment 10*a*. Like objects from the first described embodiment are depicted with the same numerals, with differences being depicted by the suffix "a" or with different numerals. In certain etching applications, the plasma etching can result in another organic masking material layer forming over the depleting original organic masking layer 18 during etching. In the context of this document, "organic" defines any material containing carbon bonded with at least some other elements which are not carbon. FIG. 4 depicts the etching proceeding whereby another organic material layer 19 forms over masking layer 18 during the etching. This layer is formed and removed during the etching and can achieve a nearly constant steady state thickness, or it may be formed and removed as the etching proceeds. This layer is shown in FIG. 4 as forming on the surface of the underlying layer mask layer and on the mask sidewalls. Some taper (less than or equal to 5 degrees) usually accompanies the growth of the layer on the mask sidewall. Both the formation on the surface of the mask and on the sidewalls of the mask can eliminate or postpone the eventual reformation of rough mask sidewalls and the transfer of this roughness into feature film 16. In the context of this example, the average maximum value of the organic layer top outer surface roughness will be that of surface 17*a* of the another organic masking material 19, and not that of photoresist where layer 18 comprises photoresist.

Further in the FIG. 4 example, masking layer 18 might constitute an inorganic material, with organic material 19 forming thereover at least during the one etching segment. By way of example only, preferred inorganic masking materials include, polysilicon, suicides and metals.

The FIGS. 1–3 example also depicts the one etching segment C as being conducted at the start of the plasma etching, and not conducted throughout all of the plasma etching. Alternately by way of example only, the one etching segment could be conducted from the start throughout all of the plasma etching. Further alternately by way of example only, the one etching segment could be conducted at the end of the plasma etching, and not otherwise conducted throughout all of the plasma etching. Further alternately by way of example only, the one etching segment could be conducted between the start and the end of the plasma etching, and not conducted at either the start or the end of the plasma etching. In one implementation, it has been discovered that conducting a later-in-time etching in accordance with the above-described preferred 70% or greater concentration results in smoothing of sidewall roughness in the feature layer occurring from an earlier-in-time plasma etching having less than 70% concentration of the subject gas.

Accordingly, one aspect of the invention contemplates plasma etching at least one feature pattern into the feature layer using the organic masking layer as a mask comprising first-in-time and second-in-time etching segments. In a first-in-time of the etching segments, an etching gas is utilized which comprises at least two gas compounds with each comprising carbon, hydrogen and at least one halogen, and each being present in the etching at greater than 30% concentration by volume as compared to all carbon, hydrogen and halogen containing gas compounds in the etching gas. The first etching segment produces a first degree of sidewall roughness along a sidewall portion of the one feature pattern being formed in the feature layer. A second etching segment is conducted after the first etching segment, with the second etching segment comprising etching at least 30% of the thickness of the feature layer using an etching gas comprising at least one gas compound present at greater than or equal to 70% concentration by volume as compared to all carbon, hydrogen and halogen containing compounds in the etching gas effective to smooth the sidewall roughness of the first degree to a smoother second degree, for example to less than 250 Angstroms or less than 100 Angstroms. Typically and preferably, the one gas compound in the second etching segment is one of the at least two gas compounds utilized in the first etching segment.

In one implementation, the invention contemplates plasma etching the at least one feature pattern into the feature layer using the organic masking layer as a mask comprising first-in-time and second-in-time etching segments. In a first-in-time of the etching segments, an etching gas is utilized which comprises at least two gas compounds with each comprising carbon, hydrogen and at least one halogen and each being present in the etching gas at greater than 30% concentration by volume as compared to all carbon, hydrogen and halogen containing gas compounds in the etching gas. The first etching segment produces a first degree of top surface roughness of the organic masking layer A second etching segment is conducted after the first etching segment, with the second etching segment comprising etching at least 30% of said thickness of the feature layer using an etching gas comprising at least one gas compound present at greater than or equal to 70% concentration by volume as compared to all carbon, hydrogen and halogen containing gas compounds in the etching gas effective to smooth the organic masking layer top surface roughness of the first degree to a smoother second degree. In only a preferred aspect of this implementation, the first segment effectively produces a rough top, and also rough sidewalls but only proximate the top in the masking layer. The second segment then preferably smooths the top and largely precludes the sidewall roughness from being transferred into the film by stopping masking layer sidewall roughness from migrating downward to adjacent the feature layer.

In one implementation, the plasma etching comprises a plurality of etching segments which total at least 30% of the thickness of the feature layer being etched. The plurality of etching segments use an etching gas comprising one gas compound comprising carbon, hydrogen and at least one halogen present in the etching gas at greater than or equal to 70% concentrations (i.e., not necessarily the same concentration in each segment) by volume as compared to all carbon, hydrogen and halogen containing gas compounds in the etching gas. Preferably, each etching segment of the plurality removes at least 1000 Angstroms of feature layer thickness. The plasma etching also comprises at least one intervening etching segment which is not one of the plurality. The intervening etching segment comprises using an etching gas comprising at least two gas compounds with each comprising carbon, hydrogen and at least one halogen and each being present in the etching gas at greater than 30% concentration by volume as compared to all carbon, hydrogen and halogen containing gas compounds in the etching gas. The plurality of etching segments, with the intervening segment(s) is effective to produce at least that portion of the one feature pattern in the feature layer to have a sidewall taper, if any, of less than or equal to 5° and an organic masking layer top outer surface roughness proximate the feature pattern at a conclusion of said plurality of etching segments which is characterizable by an average value less than 100 Angstroms as is determinable by scanning electron microscopy as an average maximum size of all surface discernible objects of the patterned masking layer as measured and averaged along any 0.3 micron length of top outer surface from the one feature pattern.

Figure 5:
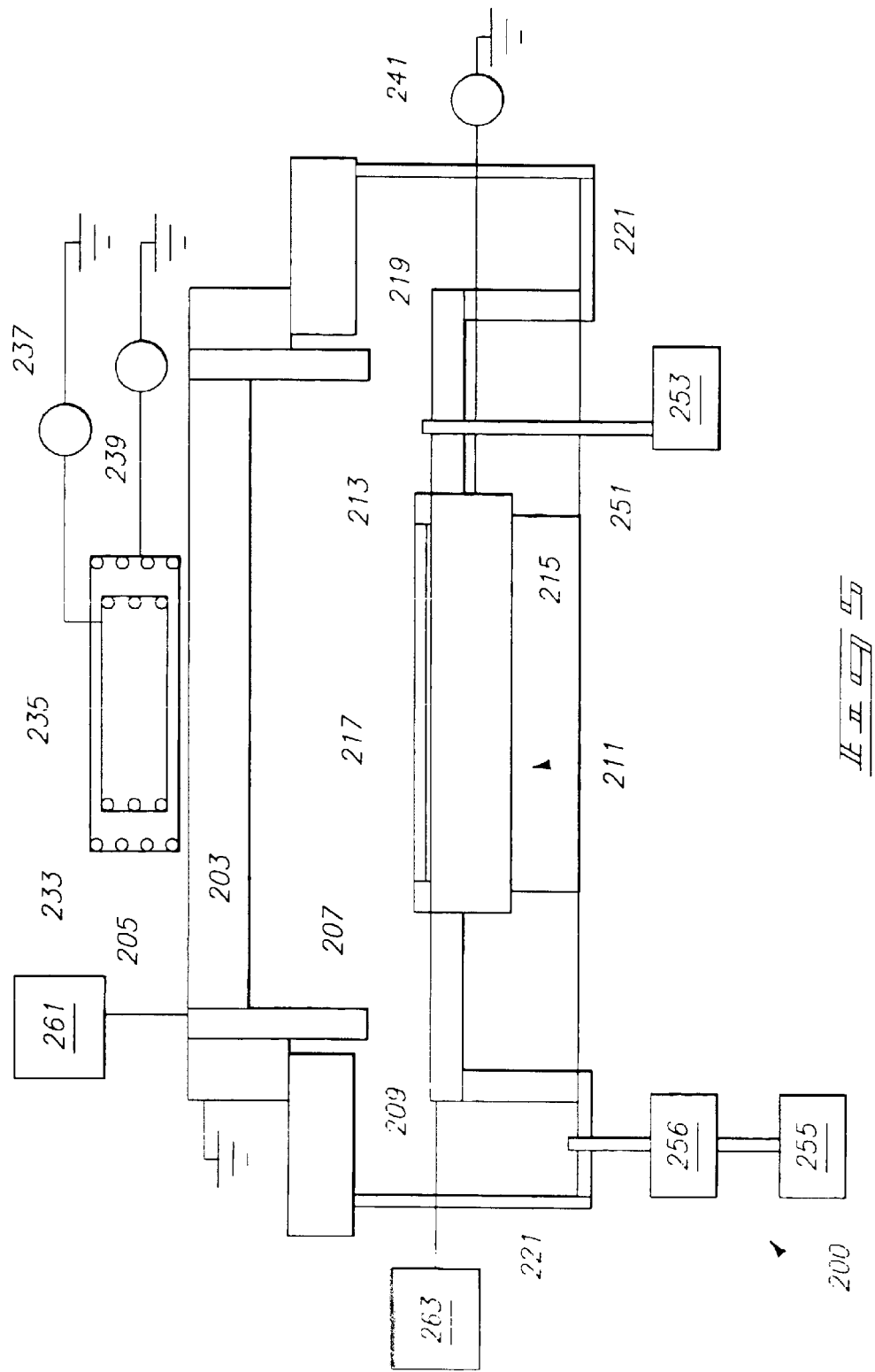
FIG. 5 is a diagrammatic sectional view of an example high density plasma etcher usable in accordance with an aspect of the invention.

FIG. 5 is a cross-sectional schematic view of one form of a plasma etcher 200, particularly an IPS Dielectric Etcher from Applied Materials, Inc., of Santa Clara, Calif. The illustrated plasma etcher 200 includes a chamber 203 defined by an RF window 205, an enclosure 207, a hot ring 209, and a substrate assembly chuck 211. The substrate assembly chuck 211 includes a collar 213 and a ceramic base 215 to support a substrate 217, such as a silicon wafer or other substrate. Exhaust ports 219 are defined by gaps between the enclosure 207 and the hot ring 209, and connect to exhaust chambers 221. The RF window 205 and the hot ring 209 are maintained at selected temperatures with respective temperature controllers 261, 263. The temperatures of the RF window 205 and the hot ring 209 are typically maintained between 120–200° C. and 150–300° C., respectively. The RF window 205 and the enclosure 207 may be made of either silicon (Si) or silicon carbide (SiC) or a combination thereof, the hot ring 209 may be made of quartz, and the collar 213 may be made of silicon carbide. Silicon, especially when heated, can remove or "getter" fluorine from the chamber 203 and thus can alter the composition of a fluorine containing gas mixture if included in the chamber 203.

In this etcher, a first set of induction coils 233 and a second set of induction coils 235 are coaxially placed in proximity to the RF window 205, with the second set 235 placed within the first set 233. RF generators 239, 237 connect to the first and second set of induction coils 233, 235, respectively. An RF bias generator 241 is provided that connects to the substrate assembly chuck 211. RF excitations (RF voltages or currents) from the RF generators 239, 237 are applied to the first and second sets of induction coils 233, 235, respectively, and produce oscillating electric and magnetic fields at the RF window 205. The RF window 205 and the chamber walls 207 in this example are grounded. Because the RF window 205 is at least partially electrically conducting, the RF window 205 shields the chamber 203 from the oscillating electric fields produced by the coils 233, 235. The oscillating electric fields are either attenuated by or, in some cases, totally blocked by the RF window 205. As a result of the shielding effect of the RF window 205, the oscillating magnetic field produced by the coils 233, 235 is primarily responsible for the generation of a plasma in the chamber 203. The RF generators 237, 239 in the illustrated etcher provide RF excitations at typical frequencies of between about 1.0–3.0 MHz.

A gas inlet 251 is connected to a gas supply manifold 253. Gases, which may be gas mixtures, for the chamber 203 are mixed at the gas manifold 253 and supplied to the chamber 203 through a gas inlet 251. A vacuum pump 255 is situated to evacuate the chamber 203 and is connected to the chamber 203 via a valve 256. During etching, the pressure in the chamber may generally be maintained in the range of from about 2 mTorr to 50 mTorr.

Example specific parameters utilizing this reactor and $CH_2F_2$ and $CHF_3$ gases for the one etching segment are as follows. $CH_2F_2$ flow is preferably at from about 45 to about 55 sccm, with $CHF_3$ flow preferably being from 0 to about 15 sccm. Outer power is preferably kept at from 620 to 760 watts, with inner power ranging from 105 to 140 watts. Substrate bias is preferably kept at between 600 and 740 watts. The temperature of the reactor roof is preferably kept at from 130° to 150° C., while that of the ring is kept at from 180° to 220° C. The backside of the substrate is preferably cooled to from between −20° C. and +10° C. Reactor pressure during deposition is preferably at or about 25 mTorr.

In a first specific reduction-to-practice example, outer power was 725 Watts, inner power was 125 Watts, and bias power was 700 Watts. Gas flow was 100% $CH_2F_2$ at 35 sccm. Chuck temperature was −10° C., window temperature at 140° C., and ring temperature at 200° C. Reactor pressure was 25 mTorr. Time of etch was 100 seconds, and the depth of the etch was 1.2 micron. The top outer surface value for smoothness/roughness was less than 10 Angstroms. The material etched was BPSG.

In a second specific reduction-to-practice example, outer power was 900 Watts, inner power was 100 Watts, and bias power was 665 Watts. Gas flow was $CH_2F_2$ at 50 sccm, $CF_4$ at 1 sccm and $CHF_3$ at 1 sccm. Chuck temperature was −10° C., window temperature at 140° C., and ring temperature at 200° C. Reactor pressure was 25 mTorr. Time of etch was 100 seconds, and the depth of the etch was 1.1 micron. The top outer surface smoothness/roughness value was less than 10 Angstroms. The material etched was BPSG.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is therefore, claimed in any of its forms or modifications within the proper scope of the appended claims appropriately interpreted in accordance with the doctrine of equivalents.

What is claimed is:

1. A plasma etching method comprising:

providing a substrate having a feature layer thereover and a patterned organic masking layer over the feature layer, the feature layer having a thickness and at least one feature pattern having a width of less than 0.3 microns and plasma etched to at least 30% of the thickness, wherein an organic masking layer top outer surface roughness proximate the feature pattern comprises a first degree of sidewall roughness greater than 100 angstroms as is determinable by scanning electron microscopy as an average maximum size of all surface discernible objects of the patterned masking layer as measured and averaged along any 0.3 micron length of top outer surface from the one feature pattern;

plasma etching the at least one feature pattern into the feature layer using the organic masking layer as a mask, the plasma etching comprising at least one etching segment where a remainder of the thickness of the feature layer is etched using an etching gas comprising $CX_aH_{(4-a)}$, provided that X is a halogen and $1 \leq a \geq 3$, the $CX_aH_{(4-a)}$ being present at greater than or equal to 70% concentration by volume as compared to all carbon, hydrogen and halogen containing gas compounds in the etching gas; and wherein the etching gas is effective to produce at least that portion of the one feature pattern in the feature layer formed during the one etching segment to have a sidewall taper, if any, of less than or equal to 5° and an organic masking layer top outer surface roughness proximate the feature pattern comprises a second degree sidewall roughness less than 100 Angstroms as is determinable by scanning electron microscopy as an average maximum size of all surface discernible objects of the patterned masking layer as measured and averaged along any 0.3 micron length of top outer surface from the one feature pattern.

2. The method of claim 1 wherein the organic masking layer comprises photoresist, the average maximum value of the organic layer top outer surface roughness being that of the photoresist top outer surface.

3. The method of claim 1 wherein the organic masking layer comprises photoresist, and another organic masking material layer forming thereover during the plasma etching, the average maximum value of the organic layer top outer surface roughness being that of the another organic masking material top outer surface and not that of the photoresist.

4. The method of claim 1 wherein the one feature pattern comprises a contact opening.

5. The method of claim 1 wherein the feature layer comprises $SiO_2$.

6. The method of claim 1 wherein the feature layer comprises $Si_3N_4$.

7. The method of claim 1 wherein the feature layer comprises polysilicon.

8. The method of claim 1 wherein the $CX_aH_{(4-a)}$ is present at greater than or equal to 80% concentration by volume as compared to all carbon, hydrogen and halogen containing gas compounds in the etching gas.

9. The method of claim 1 wherein the $CX_aH_{(4-a)}$ present at greater than or equal to 90% concentration by volume as compared to all carbon, hydrogen and halogen containing gas compounds in the etching gas.

10. The method of claim 1 wherein the $CX_aH_{(4-a)}$ is present at greater than or equal to 95% concentration by volume as compared to all carbon, hydrogen and halogen containing gas compounds in the etching gas.

11. The method of claim 1 wherein the $CX_aH_{(4-a)}$ is present at greater than or equal to 100% concentration by volume as compared to all carbon, hydrogen and halogen containing gas compounds in the etching gas.

12. The method of claim 1 wherein the $CX_aH_{(4-a)}$ is $CH_2F_2$.

13. The method of claim 1 wherein the organic masking layer top outer surface roughness proximate the feature pattern at a conclusion of the one etching segment is characterizable by an average value less than 50 Angstroms.

14. The method of claim 1 wherein the one etching segment comprises high density plasma.

15. The method of claim 1 wherein the one etching segment is conducted at the start of said plasma etching and is not conducted throughout all of said plasma etching.

16. The method of claim 1 wherein the one etching segment is conducted at the end of said plasma etching and is not conducted throughout all of said plasma etching.

17. The method of claim 1 wherein the one etching segment is conducted between the start and the end of said plasma etching, and not conducted at the start or end of said plasma etching.

18. The method of claim 1 wherein the plasma etching during the one segment is void of any etching gases having carbon nitrogen bonds.

19. The method of claim 1 wherein the plasma etching during the one segment is void of any etching gases having carbon oxygen bonds.

20. The method of claim 1 wherein the plasma etching during the one segment is void of any etching gases having oxygen oxygen bonds.

21. A plasma etching method comprising:

forming a patterned organic masking layer outwardly of a feature layer to be etched, the patterned organic masking layer having at least one feature pattern having a minimum feature dimension of less than or equal to 0.3 micron, the feature layer having a thickness;

plasma etching the at least one feature pattern into the feature layer using the organic masking layer as a mask, the plasma etching comprising a first etching segment using a first etching gas comprising $CH_2F_2$ and $CHF_3$, with the $CHF_3$ being present at greater than 30% by volume of a total of the $CH_2F_2$ and $CHF_3$ etching gases, the first etching segment producing a first degree of sidewall roughness along a sidewall portion of the one feature pattern being formed in the feature layer; and plasma etching comprising a second etching segment conducted after the first etching segment, the second etching segment comprising etching at least 30% of the thickness of the feature layer using a second etching gas comprising $CH_2F_2$ at greater than or equal to 70% concentration by volume as compared to all carbon, hydrogen and halogen containing gas compounds in the second etching gas effective to smooth the sidewall roughness of the first degree to a smoother second degree.

22. The method of claim 21 wherein the second etching segment is conducted under conditions effective to produce at least that portion of the one feature pattern in the feature layer formed during the second etching segment to have a sidewall taper, if any, of less than or equal to 5° and an organic masking layer top outer surface roughness proximate the feature pattern at a conclusion of the second etching segment which is characterizable by an average value less than 250 Angstroms as is determinable by scanning electron microscopy as an average maximum size of all surface discernible objects of the patterned masking layer as measured and averaged along any 0.3 micron length of top outer surface from the one feature pattern.

23. The method of claim 21 wherein the second etching segment is conducted under conditions effective to produce at least that portion of the one feature pattern in the feature layer formed during the second etching segment to have a sidewall taper, if any, of less than or equal to 5° and an organic masking layer top outer surface roughness proximate the feature pattern at a conclusion of the second etching segment which is characterizable by an average value less than 100 Angstroms as is determinable by scanning electron microscopy as an average maximum size of all surface discernible objects of the patterned masking layer as measured and averaged along any 0.3 micron length of top outer surface from the one feature pattern.

24. The method of claim 21 wherein the second etching gas comprises greater than or equal to 80% $CH_2CF_2$ by volume as compared to any other carbon, hydrogen and halogen containing gas compounds in the second etching gas during the second etching segment.

25. The method of claim 21 wherein the second etching gas comprises greater than or equal to 85% $CH_2CF_2$ by volume as compared to any other carbon, hydrogen and halogen containing gas compounds in the second etching gas during the second etching segment.

26. The method of claim 21 wherein second etching gas comprises greater than or equal to 95% $CH_2CF_2$ by volume as compared to any other carbon, hydrogen and halogen containing gas compounds in the second etching gas during the second etching segment.

27. The method of claim 21 wherein the second etching gas comprises greater than or equal to 100% $CH_2CF_2$ by volume as compared to any other carbon, hydrogen and halogen containing gas compounds in the second etching gas during the second etching segment.

28. The method of claim 21 wherein the plasma etching during the second segment is void of any etching gases having carbon nitrogen bonds.

29. The method of claim 21 wherein the plasma etching during the second segment is void of any etching gases having carbon oxygen bonds.

30. The method of claim 21 wherein the plasma etching during the second segment is void of any etching gases having oxygen oxygen bonds.

31. The method of claim 21 wherein at least the second etching segment comprises high density plasma.

32. A plasma etching method comprising:
    forming a patterned organic masking layer outwardly of a feature layer to be etched, the patterned organic masking layer having at least one feature pattern having a minimum feature dimension of less than or equal to 0.3 micron, the feature layer having a thickness,
    plasma etching the at least one feature pattern into the feature layer using the organic masking layer as a mask, the plasma etching comprising a first etching segment using a first etching gas comprising at least two compounds of the formula $CX_aH_{(4-a)}$ provided that X is a halogen and 1<a>3, wherein individual ones of the two compounds are at greater than or equal to 30% concentration by volume as compared to all carbon, hydrogen, and halogen containing gas compounds in the first etching gas and the first etching segment produces a first degree of sidewall roughness of the one feature pattern being formed in the feature layer; and
    plasma etching comprising a second etching segment conducted after the first etching segment, the second etching segment comprising etching at least 30% of the thickness of the feature layer using a second etching gas comprising 70% by volume as compared to all carbon, hydrogen, and halogen containing gas compounds in the second etching gas, at least one compound of the formula $CX_aH_{(4-a)}$, provided that X is a halogen and 1<a>3, the etching being effective to smooth the sidewall roughness of the first degree to a smoother second degree.

33. The method of claim 32 wherein the $CX_aH_{(4-a)}$ of the second etching gas is one of the two compounds of the first etching gas.

34. The method of claim 32 wherein the second etching gas comprises greater than or equal to 80% by volume of the $CX_aH_{(4-a)}$ as compared to any other carbon, hydrogen and halogen containing gas compounds in the second etching gas during the second etching segment.

35. The method of claim 32 wherein second etching gas comprises greater than or equal to 90% by volume of the $CX_aH_{(4-a)}$ as compared to any other carbon, hydrogen and halogen containing gas compounds in the second etching gas during the second etching segment.

36. The method of claim 32 wherein the second etching gas comprises greater than or equal to 95% by volume of the $CX_aH_{(4-a)}$ as compared to any other carbon, hydrogen and halogen containing gas compounds in the second etching gas during the second etching segment.

37. The method of claim 32 wherein the second etching gas comprises greater than or equal to 100% by volume of the $CX_aH_{(4-a)}$ as compared to any other carbon, hydrogen and halogen containing gas compounds in the second etching segment.

38. The method of claim 32 wherein the plasma etching during the second segment is void of any etching gases having carbon nitrogen bonds.

39. The method of claim 32 wherein the plasma etching during the second segment is void of any etching gases having carbon oxygen bonds.

40. The method of claim 32 wherein the plasma etching during the second segment is void of any etching gases having oxygen oxygen bonds.

41. The method of claim 32 wherein the second etching segment is conducted under conditions effective to produce at least that portion of the one feature pattern in the feature layer formed during the second etching segment to have a sidewall taper, if any, of less than or equal to 5° and an organic masking layer top outer surface roughness proximate the feature pattern at a conclusion of the second etching segment which is characterizable by an average value less than 100 Angstroms as is determinable by scanning electron microscopy as an average maximum size of all surface discernible objects of the patterned masking layer as measured and averaged along any 0.3 micron length of top outer surface from the one feature pattern.

42. The method of claim 32 wherein at least the second etching segment comprises high density plasma.

43. A plasma etching method comprising:
    forming a patterned organic masking layer outwardly of a feature layer to be etched, the patterned organic masking layer having at least one feature pattern having a minimum feature dimension of less than or equal to 0.3 micron, the feature layer having a thickness; and
    plasma etching the at least one feature pattern into the feature layer using the organic masking layer as a mask, the plasma etching comprising at least one etching segment where at least 30% of the thickness of the feature layer is etched using an etching gas comprising one gas compound comprising carbon, hydrogen and at least one halogen present in the etching gas at greater than or equal to 70% concentration by volume as compared to all carbon, hydrogen and halogen containing gas compounds in the etching gas effective to produce at least that portion of the one feature pattern in the feature layers formed during the one etching segment to have a sidewall taper, if any, of less than or equal to 5° and an organic masking layer top outer surface roughness proximate the feature pattern at a conclusion of the one etching segment which is characterizable by an average value less than 100 Angstroms as is determinable by scanning electron microscopy as an average maximum size of all surface discernible objects of the patterned masking layer as measured and averaged along any 0.3 micron length of top outer surface from the one feature pattern, wherein the organic masking layer comprises photoresist, and another organic masking material layer forming there over during the plasma etching, the average maximum value of the organic layer top outer surface roughness being that of the another organic masking material top outer surface and not that of the photoresist, wherein the feature layer comprises a material chosen from a group consisting of: polysilicon, $SiO_2$ and $Si_3N_4$.

44. The method of claim 43 wherein the one feature pattern comprises a contact opening.

45. The method of claim 43 wherein the plasma etching comprises only one etching segment where 100% of the thickness of the feature layer is etched using said etching gas.

46. The method of claim 43 wherein the organic masking layer comprises photoresist, the average maximum value of the organic layer top outer surface roughness being that of the photoresist top outer surface.

47. The method of claim 43 wherein the one gas compound is present in the etching gas at greater than or equal to 80% concentration by volume as compared to any other carbon, hydrogen and halogen containing gas compound(s) in the etching gas during the one etching segment.

48. The method of claim 43 wherein the one gas compound is present in the etching gas at greater than or equal to 90% concentration by volume as compared to any other carbon, hydrogen and halogen containing gas compound(s) in the etching gas during the one etching segment.

49. The method of claim 43 wherein the one gas compound is present in the etching gas at greater than or equal to 95% concentration by volume as compared to any other carbon, hydrogen and halogen containing gas compound(s) in the, etching gas during the one etching segment.

50. The method of claim 43 wherein the one gas compound is present in the etching gas at 100% concentration by volume as compared to any other carbon, hydrogen and halogen containing gas compound(s) in the etching gas during the one etching segment.

51. The method of claim 43 wherein the one gas compound is $CH_2F_2$.

52. The method of claim 43 wherein the average value of roughness is less than or equal to 50 Angstroms.

53. The method of claim 21 wherein the second etching gas consists essentially of $CH_2CF_2$.

* * * * *

UNITED STATES PATENT AND TRADEMARK OFFICE
CERTIFICATE OF CORRECTION

PATENT NO. : 6,812,154 B2
DATED : November 2, 2004
INVENTOR(S) : Becker et al.

It is certified that error appears in the above-identified patent and that said Letters Patent is hereby corrected as shown below:

Column 1,
Line 38, please delete "$CHF_3$" after "and" and insert -- $CH_2F_2$ --.
Line 40, please delete "below." after "and" and insert -- below, --.

Column 5,
Line 47, please delete "suicides" after "polysilicon," and insert -- silicides --.

Column 9,
Line 35, please insert -- is -- after "$CX_aH_{(4-a)}$".

Column 11,
Line 31, please delete "$CX_aH_{(4-1)}$" after "formula" and insert -- $CX_aH_{(4-a)}$ --.
Lines 32 and 47, please delete "1<a>3," after "and" and insert -- $1 \leq a \geq 3$, --.

Signed and Sealed this

Thirty-first Day of May, 2005

JON W. DUDAS
*Director of the United States Patent and Trademark Office*